United States Patent [19]

Imamura

[11] Patent Number: 4,833,051
[45] Date of Patent: May 23, 1989

[54] PROTECTIVE DEVICE FOR PHOTOGRAPHIC MASKS

[75] Inventor: Kazunori Imamura, Tokyo, Japan

[73] Assignee: Nippon Kogaku K.K., Okyo, Japan

[21] Appl. No.: 136,427

[22] Filed: Dec. 17, 1987

Related U.S. Application Data

[63] Continuation of Ser. No. 766,760, Aug. 16, 1985, abandoned.

[30] Foreign Application Priority Data

Aug. 20, 1984 [JP] Japan ............................ 59-125270[U]
Apr. 23, 1985 [JP] Japan .................................. 60-85383

[51] Int. Cl.⁴ ............................................... G03F 9/00
[52] U.S. Cl. .......................................... 430/5; 269/8; 269/21; 335/285; 355/76
[58] Field of Search ...................... 430/5, 321; 355/87, 355/72, 76, 91, 94; 269/21, 8; 335/285

[56] References Cited

U.S. PATENT DOCUMENTS 3,927,943 12/1975 Pohl et al. ............................ 355/132
4,032,233 6/1977 Oscarsson et al. .................... 355/91
4,159,176 6/1979 de Maji ................................. 355/79
4,255,216 3/1981 Conant et al. ......................... 156/80
4,584,216 4/1986 Kenworthy et al. .................. 428/38

FOREIGN PATENT DOCUMENTS 56-70553 6/1981 Japan ....................................... 430/5
58-100852 6/1983 Japan ....................................... 430/5

*Primary Examiner*—Jose G. Dees
*Attorney, Agent, or Firm*—Michael N. Meller

[57] ABSTRACT

A protective device for photographic masks or reticles used in the photolithographic operation for fabricating semiconductor devices. The protective device includes a frame having a protective pellicle attached thereover and the frame includes temporary fastening means for detachably fastening the frame to a mask substrate. The temporary fastening is effected by using for example vacuum chucking, magnetic attractive force or spring force. The frame may be formed with vent holes each having a filter so that the internal pressure of the space enclosed by the pellicle and the frame on the mask is made equal to the outside air pressure.

8 Claims, 6 Drawing Sheets

PROTECTIVE DEVICE FOR PHOTOGRAPHIC MASKS

This application is a continuation, of application Ser. No. 766,760, filed 8/16/85 now abandoned.

BACKGROUND OF THE INVENTION

1. Field of the Invention

The present invention relates to improvements in and relating to protective devices for photographic masks or reticles used in the fabrication of integrated circuits.

2. Description of the Prior Art

In the past, in order to protect the surface of photographic masks or reticles from dust, devices have been known in which, for example, a transparent thin film referred to as a pellicle is attached over one open surface of a frame of a size sufficient to enclose the pattern area on a substrate of a mask and the other open surface of the frame is made fast with an adhesive or adhesive tape to the substrate in such a manner that the pattern area is included within the frame. In this device, the pellicle is supported by the frame at a predetermined distance from the pattern on the surface of the substrate.

Such protective pellicle has the function of preventing the deposition of dust on the substrate of a mask and protecting the mask and it contributes toward improving the productivity of integrated circuits, etc.

For instance, if dust deposits on a photographic mask for semiconductor fabrication purposes, there is the danger of the pattern of the dust being projected onto a semiconductor wafer during the photolithographic operation and thereby deteriorating the reliability of the resulting semi-conductor devices due to operational malfunctions, etc. Then, by using the previously mentioned protective device, it is possible to shut off the atmosphere on the mask from the outside air and thereby alleviate the deficiencies.

On the other hand, if any foreign particles such as dust deposit on the surface of a mask substrate having a pellicle already mounted thereon or to the inner surface of the pellicle, the pellicle must be removed from the substrate to clean the substrate or the pellicle again. However, the pellicle mounted on the mask substrate by the frame cannot be easily removed from the mask substrate, with the resulting inconveniences that the surface of the substrate is damaged during the removing, that the removed pellicle becomes unsuitable for reuse and so on.

Also, while the frame of the pellicle must be aligned with the mask substrate so as to enclose the pattern area, if the position of the frame is beyond a predetermined error range, it is also necessary to remove the frame and to again adhere the frame in the proper position. In such a case, the fixedly mounted pellicle frame is also inconvenient.

Further, the space enclosed by the mask substrate, the frame and the pellicle is in very excellently sealed condition hermetically. As a result, when the mask is transported by aircraft or transferred to a high altitude, the pressure difference between the internal pressure and the external pressure causes the pellicle attached to the frame to bulge or become depressed. Such deformation of the pellicle is disadvantageous in that not only the optical characteristics of the pellicle itself are changed, but also, depending on the degree of the deformation, the pellicle is caused to contact with the surface of the mask substrate or the pellicle is damaged by contacting with any metal part in the surroundings during the transport of the mask within a projection apparatus and so on.

SUMMARY OF THE INVENTION

It is an object of the present invention to provide a protective device for photographic masks which overcomes the foregoing deficiencies in the prior art and which includes a protective pellicle or pellicles that can be easily removed from a mask substrate as occasion demands.

It is another object of the invention to provide such protective device for photographic masks which prevents any deformation of a protective pellicle due to a change in the atmospheric pressure.

In accordance with the invention, a pellicle-equipped frame or frames include temporary fastening means for detachably mounting the frames on the surfaces of a mask substrate.

In accordance with a preferred embodiment of the invention, vacuum chucking is utilized for temporary fastening purposes.

In accordance with another preferred embodiment of the invention, the attractive force of magnets or the pressing force of springs is utilized for temporary fastening purposes.

In accordance with one aspect of the invention, each frame is formed with one or more vent holes so as to prevent the occurrence of any pressure difference between the space enclosed by the pellicle and the frame and the outside air.

In accordance with still another embodiment of the invention, a filter element for preventing the passage of dust is provided for each vent hole.

DESCRIPTION OF THE PREFERRED EMBODIMENTS

Some embodiments of the invention utilizing vacuum chucking for temporarily fastening a pellicle or pellicles to a substrate will now be described.

Figure 1:
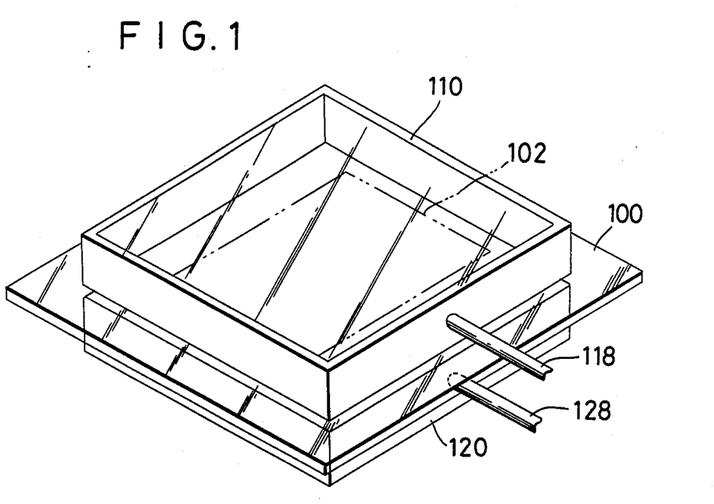
FIG. 1 is a perspective view showing a first embodiment of the invention.
Figure 2:
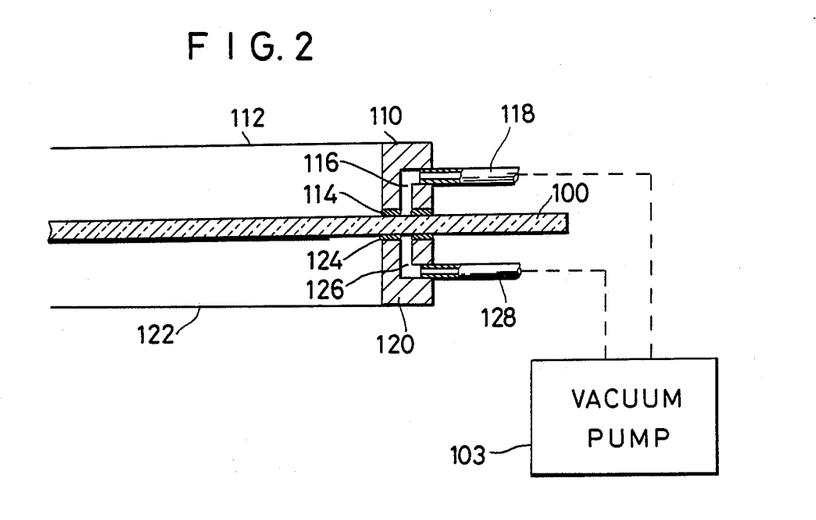
FIG. 2 is a sectional view of the principal part of FIG. 1.

Referring to FIG. 1, arranged on the upper surface of a glass substrate 100 of a photographic mask is a frame 110 having a pellicle 112 horizontally attached over the upper edge thereof and arranged on the lower surface of the glass substrate 100 is a frame 120 having a pellicle 122 horizontally attached over the lower edge thereof. The other edges of the frames 110 and 120 facing the glass substrate 100 are respectively provided with buffer or cushioning materials 114 and 124 made of silicone rubber or the like as shown in FIG. 2 and each of the frames is held in contact with the glass substrate 100 through its cushioning material so as to enclose a pattern area 12 consisting of opaque and transparent areas and formed on the lower surface of the glass substrate 100.

Provided inside the frames 110 and 120 are grooves or a series of holes 116 and 126 which are formed along the shape of the frames 110 and 120 and opened to the glass substrate 100. The grooves or series of holes 116 and 126 are respectively communicated by air intake ports surrounding the interiors of the frames 110 and 120 and the intake ports are connected to a vacuum pump 103 through pipes 118 and 128 from one or more openings formed in each of the frames 110 and 120.

After the absence of defects, flaws and deposited foreign particles on the glass substrate 100 and the frames 110 and 120 has been confirmed, the frames 110 and 120 are mounted on the substrate 100 through the cushioning materials 114 and 124 and they are then chucked by the vacuum pump 103. Then, the presence of any foreign particles is again checked so that if the check detects the presence of any defects or foreign particles which cause trouble in the manufacturing operation of integrated circuits, the vacuum chucking is immediately stopped and the frames are demounted, thereby cleaning the photographic mask and removing the foreign particles. On the contrary, if the check determines that the condition is proper, the vacuum chucking may be continued as such or alternatively it is possible to fasten the frames to the glass substrate by applying an adhesive to and around their boundaries and then stop the vacuum chucking.

Figure 3:
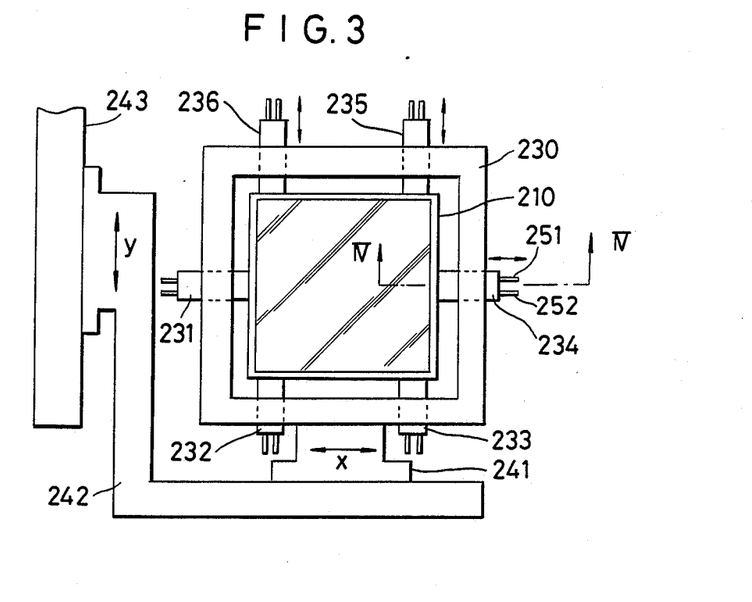
FIG. 3 is a plan view showing a second embodiment of the invention.
Figure 4:
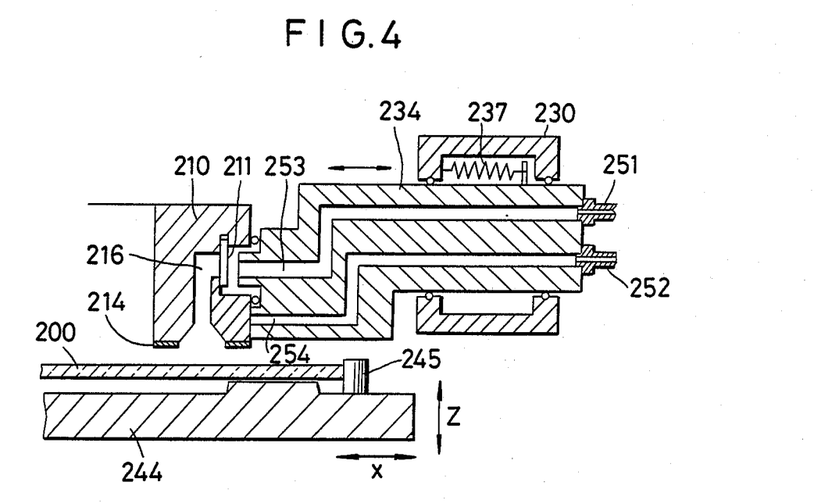
FIG. 4 is a sectional view taken along the line IV—IV of FIG. 3.

FIGS. 3 and 4 show a second embodiment of the invention so constructed that a pellicle is automatically mounted on a photographic mask by means of vacuum chucking More specifically, a frame 210 fitted with a pellicle is supported inside a frame member 230 by protruding elements 231, 232 and 233 which are secured to the frame member 230 and movable protruding elements 234, 235 and 236 which are each movable in the directions indicated by an arrow relative to the frame member 230 and which are each biased against the frame 210 by a spring 237. Attached to the frame member 230 is a slider 241 which is movable in the direction of x along an L-shaped member 242 and the L-shaped member 242 is also movable along a guide 243 in the direction of y. Thus, the frame 210 can be aligned with a photographic mask 200 in the directions of x and y. The photographic mask 200 is aligned and mounted on an x-y stage 24 by means of pins 245.

Each of the protruding elements 231 to 236 is fitted with pipes 251 and 252 which are connected to a vacuum pump which is not shown. The pipes 252 are provided to fasten the frame 210 to the frame member 230 through holes 254 and the pipes 251 are provided to hold the frame 210 and the photographic mask 200 together through holes 253. The frame 210 includes valves 211 so that when the vacuum pump is operated with the frame 210 placed on the photographic mask 200 through a cushioning material 214, the valves 211 are opened and the pressure in grooves or a series of holes 216 is reduced. Thereafter, even if the operation of the vacuum pump is stopped, the valves 211 are closed and the reduced pressure condition is maintained.

The actual operation will now be described in greater detail. In order to fasten the frame 210 to the frame member 230, the movable protruding elements 234, 235 and 236 are moved backward and the frame 210 is brought into contact with the fixed protruding elements 231, 232 and 233. Then, the movable protruding elements 234 to 236 are moved forward and the frame 210 is supported by the six protruding elements.

Then, after the photographic mask 200 has been mounted on the stage 244 and transferred to below the lower surface of the frame member 210, the stage 244 is raised or lowered until it reaches a position where the distance between the upper surface of the mask 200 and the lower surface of the frame 210 is several mm. At this time, only the pipes 252 are vacuum sucked. In this condition, the frame member 230 is aligned in the x and y directions and the frame 210 is positioned in place relative to the mask 200. After the alignment has been made, the stage 244 is raised so that the cushioning material 214 is brought into contact with the mask 200 and vacuum sucking is effected through the pipes 251. This vacuum sucking need not be effected continuously and it is necessary to effect the vacuum sucking for a moment owing to the provision of the valves 211. As a result, the frame 210 is chucked to the mask 200. Then, after the vacuum sucking through the pipes 252 has been released, the movable protruding elements 234, 235 and 236 are moved backward and the stage 244 is lowered, thereby mounting the frame 210 on the upper surface of the mask 200 in its temporarily fastened condition. Since this operation can be entirely performed automatically, it is possible to apply this operation to a pellicle automatic attaching apparatus to perform the following sequence of operations fully automatically. Namely, the operations include a mask cleaning step by a cleaning machine, a frame tacking step, a foreign particle inspection step, an adhesion step for fastening the frame to the mask with an adhesive if the result of the inspection is normal, and a step of removing the frame and performing the operation again if any abnormal condition is found as a result of the inspection.

It is to be noted that a device for forcing the valves 211 to open may be employed to remove the temporarily fastened frame from the mask. Of course, the above-mentioned embodiment can be realized without the valves.

Figure 5:
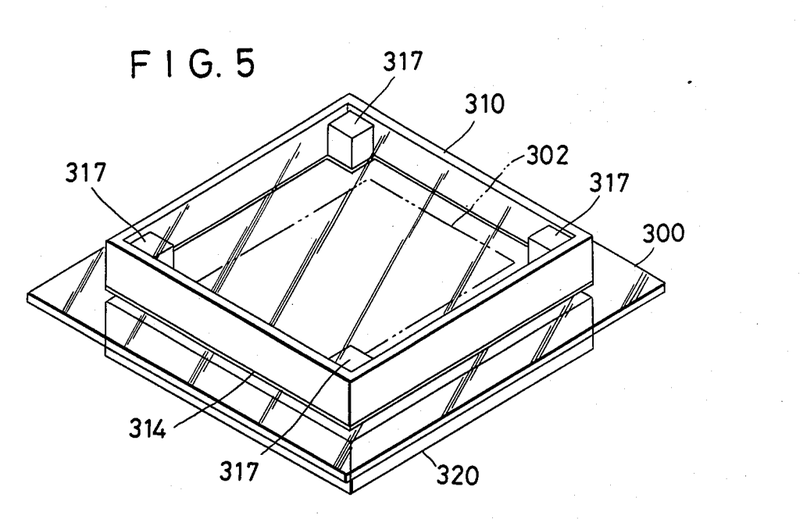
FIG. 5 is a perspective view showing a third embodiment of the invention.
Figure 6:
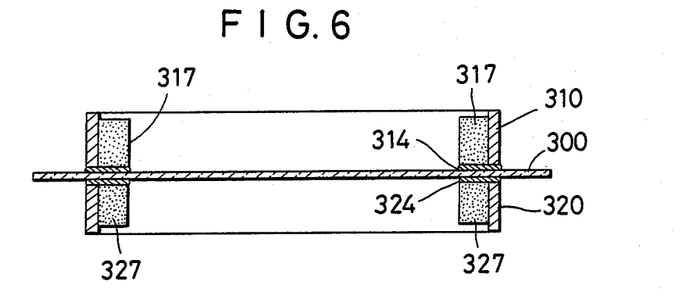
FIG. 6 is a sectional view of FIG. 5.
Figure 7:
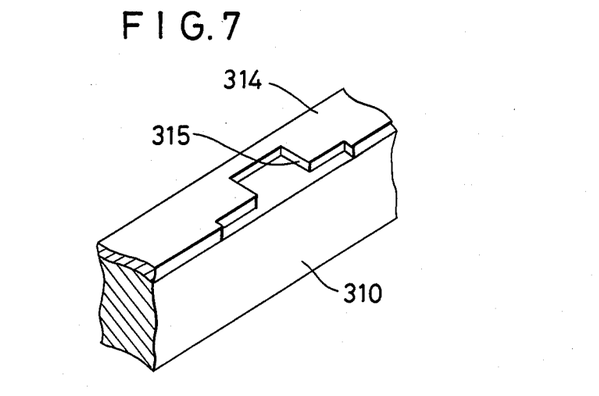
FIG. 7 is an enlarged perspective view of a part of FIG. 5.

Referring to FIGS. 5 to 7, there is illustrated a third embodiment of the invention which temporarily fastens pellicles to a substrate by means of magnets.

Frames 310 and 320 each fitted with a pellicle are arranged on both sides of a photographic mask glass substrate 300 in the like manner as FIG. 1. The frames 310 and 320 are respectively provided with sheet materials 314 and 324 at their edges which contact with the glass substrate 300. The sheets 314 and 324 are made of a soft material such as rubber or synthetic resin and are formed to have a thickness of about 0.1 to 2.0 mm. FIG. 7 shows in an enlarged form a part of the joint between the frame 310 and the sheet material 314. As shown in the Figure, the sheet 314 is formed with a notch 315 at a plurality of places as occasion demands. This is the same with the sheet material 324.

The frames 310 and 320 are respectively provided with magnets 317 and 327 at their corners. Each of the magnets 317 has a polarity selected such that an attractive force acts between its and the opposing magnet 327. Thus, when the frames 310 and 320 are aligned in such a manner that a mask pattern area 302 is not covered by them and the pellicles are mounted to hold the glass substrate 300 therebetween from the sides thereof, an attractive force due to the magnets 317 and 327 acts so as to temporarily fasten the pellicles to the glass substrate 300.

After the completion of the temporary fastening of the pellicles in the proper positions, the notches 315 of the sheet materials 314 and 324 are filled with an adhesive to reinforce the joint. However, this fastening with an adhesive is not always required.

It is to be noted that one or the other of the magnets 317 and 318 may be replaced with a magnetic material such as iron or nickel.

Figure 8:
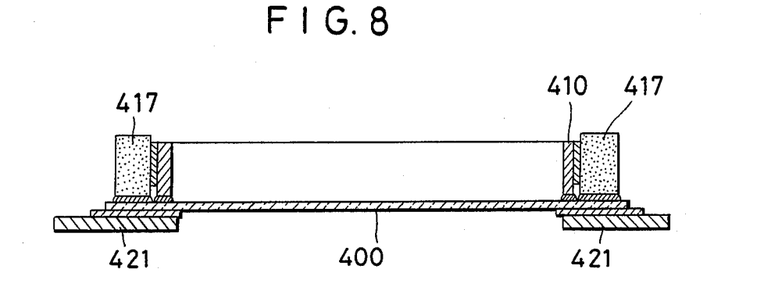
FIG. 8 is a sectional view showing a fourth embodiment of the invention.

When it is desired to fasten a pellicle only to one surface of a photographic mask, as shown in FIG. 8, a frame 410 is placed on one surface of a glass substrate 400 on which a master pattern is formed. In this case, magnets 417 are fixedly mounted at several places on the outside of the frame 410. A plate element 421 made of a magnetic material is arranged on the opposite surface of the glass substrate 400. A sheet material is placed between the frame 410 and the magnets 417 and between the plate element 421 and the glass substrate 400.

Figure 9:
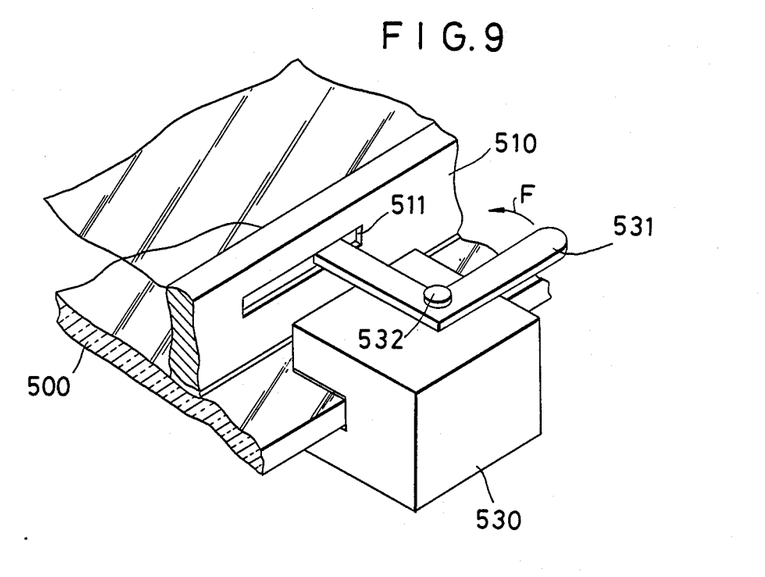
FIG. 9 is a perspective view showing the principal part of a fifth embodiment of the invention.

FIG. 9 shows a fifth embodiment of the invention in which the mechanical force of springs or the like is utilized to temporarily fasten a pellicle to a photographic mask.

Slits 511 are formed in the outer sidewalls of a frame 510. A supporting block 530 made of a synthetic resin is mounted on the side edge of a glass substrate 500 near to each of the slits 511. Each block 530 is formed with a notch for fastening it to the glass substrate 500. An L-shaped plate spring 531 is attached to the upper part of the block 530 so as to rotate about a fastening pin 532. When the plate springs 531 are each rotated to the illustrated position, the forward end of each plate spring 531 enters into the slit 511 and the frame 510 is biased against the glass substrate 500.

With a pellicle fastened temporarily or completely with an adhesive to a photographic mask in accordance with each of the previously mentioned embodiments, the construction of the below-mentioned embodiment is effective in preventing the pellicle from being deformed and damaging its flatness due to the pressure difference between the inside and outside the pellicle.

Figure 10:
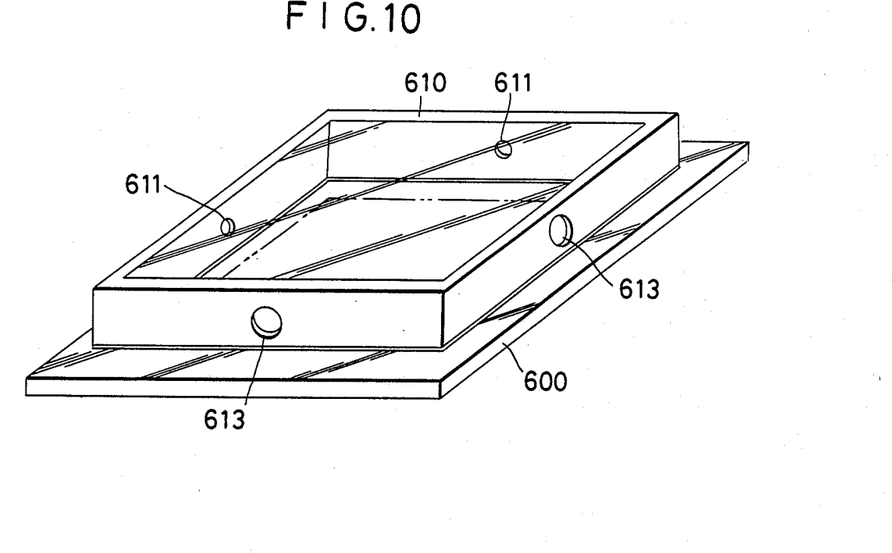
FIG. 10 is a perspective view showing a sixth embodiment of the invention.
Figure 11:
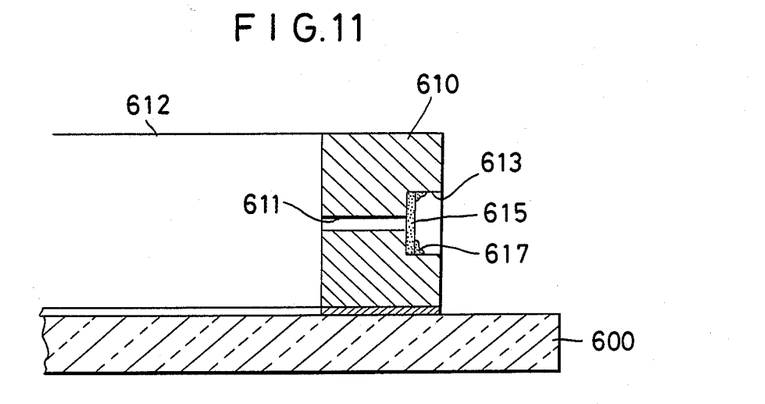
FIG. 11 is a sectional view of the principal part of FIG. 10.

Referring to FIGS. 10 and 11, a vent hole 611 is formed in each of the sides of a frame 610 supporting a pellicle 612. Each vent hole 611 has a diameter of about 0.5 to 2 mm, for example, and it is connected with a large-diameter portion 613 in the outer side of the frame 610. Also, a stepped portion is formed between the vent hole 611 and the large-diameter portion 613. From the outside of the frame 610 a filter 615 is fastened with an adhesive 617 to the stepped portion so as to be mounted on the vent hole 611. The filters 615 are substantially the same in diameter with the large-diameter portions 613 and in this way consideration is given to prevent each filter 615 from entering into the vent hole 611 even if it falls off the stepped portion.

The filters 615 of the type which allows the passage of air and prevents the passage of dust are used and membrane-type filters are preferred. For example, MF Millipore filters (trade name) or Cellotate filters (trade name) sold by Millipore Corporation may be used. Of these, MF Millipore filters are permeable filters made of cellulose-mixed ester as a raw material and the Cellotate filters are permeable filters made of cellulose acetate as a raw material. It is to be noted that in a reduction projection-type exposure apparatus and the like, the focal depth of a projection lens is very small and therefore foreign particles of less than a predetermined size, e.g., about 0.5 to 1.0 mm, are not resolved. Thus, the use of filters which would pass dust of such size along with air presents no difficulty from a practical point of view.

A closed space enclosed by the glass substrate 600, the frame 610 and the pellicle 612 is communicated with the external space through the filters 615. Thus, there is no danger of causing any unbalance between the pressure in the closed space and the pressure in the external space.

Figure 12:
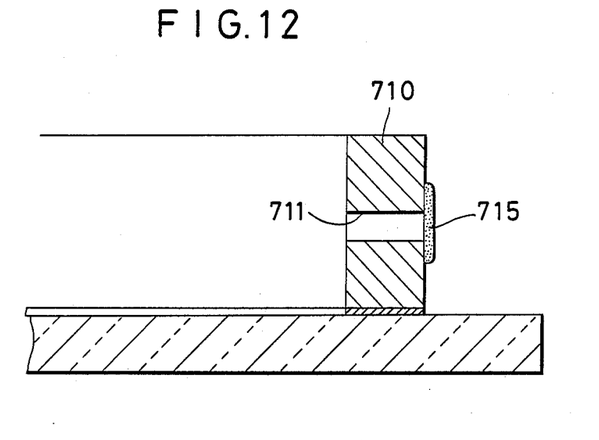
FIG. 12 is a sectional view showing a first modification of the embodiment shown in FIG. 10.
Figure 13:
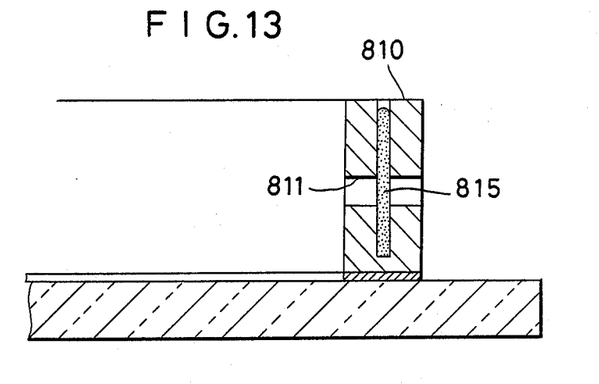
FIG. 13 is a sectional view showing a second modification of the embodiment of FIG. 10.

Various modifications of the vent holes 611 and the filters 615 may be conceived as shown in FIG. 12 in which filter 715 is adhered to the outer side of each vent hole 711 of a frame 710 or in FIG. 13 in which a filter 810 is inserted in a frame 810 so as to traverse each vent hole 811.

I claim:
1. A device for protecting a surface of a transparent substrate having a pattern of opaque and transparent areas, comprising:
   at least one frame means arranged on one surface of said substrate to enclose said pattern, said frame means having one peripheral edge thereof positioned at a predetermined distance from the surface of said substrate and the other peripheral edge thereof uniformly contacting the surface of said substrate;
   a transparent pellicle attached over said one peripheral edge of said frame means to cover the surface of said substrate including said pattern; and
   a pair of magnetic means oppositely arranged on the one and other surfaces of said substrate to produce a magnetic attractive force therebetween, one of said magnetic means being fixedly mounted on said frame means.

2. The device according to claim 1, wherein said second magnetic means is fixedly mounted on the other surface of said substrate.

3. The device according to claim 1, further comprising a second frame means having one peripheral edge thereof positioned at a predetermined distance from the other surface of said substrate and the other peripheral edge thereof in contact with the other surface of said substrate and arranged to enclose said pattern, and another transparent pellicle attached over said one peripheral edge of said second frame means to cover the other surface of said substrate, and wherein said magnetic means is fixedly mounted on said second frame means.

4. A device according to claim 1, wherein one of said first and second magnetic means includes a magnet and the other of said first and second magnetic means is made from a material which is capable of being attracted to the magnet.

5. A device for protecting a surface of transparent substrate having a pattern of opaque and transparent areas, comprising:

frame means arranged on the surface of said substrate to enclose said pattern, said frame means having one peripheral edge which lies in a plane substantially parallel with the surface of said substrate and is positioned at a predetermined distance from the surface of said substrate and the other peripheral edge uniformly contacting the surface of said substrate;

a transparent pellicle attached over said one peripheral edge of said frame means to cover the surface of said substrate, including said pattern;

means for securing the surface of said substrate with said other peripheral edge of said frame means;

ventilation means provided on said frame means for enabling communication between a space between said substrate and said pellicle and bounded by said frame means on its periphery and a surrounding space; and filter means disposed between said enclosed space and said surrounding space for preventing dust from entering into said enclosed space through said ventilation means.

6. A device according to claim 5, wherein said frame means includes a rectangular frame having four side walls, said ventilation means includes at least one vent hole passing through one of said side walls of said frame means from said enclosed space to said surrounding space, and said filter means is arranged to cover said vent hole.

7. A device according to claim 6, wherein said vent hole includes a first hole portion having a first diameter and a second hole portion having a second diameter smaller than said first diameter, said second hole portion is disposed between said enclosed space and said first hole portion and has an end portion connected with an end portion of said first hole portion, and said filter means has a size larger than said second diameter and is disposed in said first hole portion.

8. A device according to claim 6, wherein said filter means includes a filter member fixed inside of said vent hole.

* * * * *